(12) United States Patent
Wang et al.

(10) Patent No.: US 10,504,943 B2
(45) Date of Patent: Dec. 10, 2019

(54) METHOD FOR MANUFACTURING AN ARRAY SUBSTRATE MOTHERBOARD

(71) Applicants: BOE TECHNOLOGY GROUP CO., LTD., Beijing (CN); BEIJING BOE DISPLAY TECHNOLOGY CO., LTD., Beijing (CN)

(72) Inventors: Jing Wang, Beijing (CN); Huibin Guo, Beijing (CN); Xiangqian Ding, Beijing (CN); Jinchao Bai, Beijing (CN); Yao Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/544,562

(22) PCT Filed: Jan. 11, 2017

(86) PCT No.: PCT/CN2017/070833
§ 371 (c)(1),
(2) Date: Jul. 19, 2017

(87) PCT Pub. No.: WO2017/185830
PCT Pub. Date: Nov. 2, 2017

(65) Prior Publication Data
US 2019/0043898 A1    Feb. 7, 2019

(30) Foreign Application Priority Data

Apr. 28, 2016    (CN) .......................... 2016 1 0274032

(51) Int. Cl.
*H01L 21/768* (2006.01)
*H01L 27/12* (2006.01)
(Continued)

(52) U.S. Cl.
CPC ........ *H01L 27/1288* (2013.01); *G02F 1/1368* (2013.01); *G02F 1/13439* (2013.01);
(Continued)

(58) Field of Classification Search
CPC ......... H01L 21/02063; H01L 21/76802; H01L 21/76805; H01L 21/76816
See application file for complete search history.

(56) References Cited

U.S. PATENT DOCUMENTS

2005/0082532 A1\* 4/2005 Murakami .......... H01L 51/5203
257/72
2015/0014693 A1\* 1/2015 Lee ....................... H01L 27/124
257/72
(Continued)

FOREIGN PATENT DOCUMENTS

CN        101452933 A        6/2009
CN        102097389 A        6/2011
(Continued)

OTHER PUBLICATIONS

First Office Action for Chinese Application No. 201610274032.X, dated Jul. 4, 2018, 9 Pages.
(Continued)

*Primary Examiner* — Hoai V Pham
(74) *Attorney, Agent, or Firm* — Brooks Kushman P.C.

(57) ABSTRACT

An array substrate motherboard, a manufacturing method thereof and a display device are provided. The manufacturing method includes forming a film layer pattern for a first display product at a first region of a base substrate and forming a film layer pattern for a second display product at a second region of the base substrate. The first display product has deep holes at a density larger than the second display product, and each deep hole is a via-hole penetrating through at least two insulation layers. Specifically, the
(Continued)

manufacturing method include: prior to forming a second conductive pattern on an insulation layer, reducing a thickness of the insulation layer at the first region; and forming the second conductive pattern on the insulation layer, and enabling the second conductive pattern to be connected to a first conductive pattern under the insulation layer through a via-hole structure penetrating through the insulation layer.

11 Claims, 2 Drawing Sheets

(51) Int. Cl.
| | |
|---|---|
| *G02F 1/1343* | (2006.01) |
| *G02F 1/1362* | (2006.01) |
| *G02F 1/1368* | (2006.01) |
| *G03F 7/038* | (2006.01) |
| *G03F 7/039* | (2006.01) |
| *G03F 7/16* | (2006.01) |
| *G03F 7/20* | (2006.01) |
| *G03F 7/32* | (2006.01) |
| *H01L 21/027* | (2006.01) |

(52) U.S. Cl.
CPC .. *G02F 1/134363* (2013.01); *G02F 1/136227* (2013.01); *G02F 1/136286* (2013.01); *G03F 7/038* (2013.01); *G03F 7/039* (2013.01); *G03F 7/16* (2013.01); *G03F 7/20* (2013.01); *G03F 7/32* (2013.01); *H01L 21/0274* (2013.01); *H01L 27/124* (2013.01); *H01L 27/1248* (2013.01); *H01L 27/1262* (2013.01); *G02F 2001/136236* (2013.01); *G02F 2001/136295* (2013.01); *G02F 2201/121* (2013.01); *G02F 2201/123* (2013.01)

(56) References Cited

U.S. PATENT DOCUMENTS

| | | |
|---|---|---|
| 2016/0027799 A1 | 1/2016 | Wang |
| 2016/0226018 A1* | 8/2016 | Akagawa ............ H01L 51/5246 |

FOREIGN PATENT DOCUMENTS

| | | |
|---|---|---|
| CN | 202421681 U | 9/2012 |
| CN | 103681488 A | 3/2014 |
| CN | 105957867 A | 9/2016 |
| KR | 20010047795 A | 6/2001 |

OTHER PUBLICATIONS

International Search Report and Written Opinion for Application No. PCT/CN2017/070833, dated Apr. 12, 2017, 10 Pages.

* cited by examiner

METHOD FOR MANUFACTURING AN ARRAY SUBSTRATE MOTHERBOARD

CROSS-REFERENCE TO RELATED APPLICATIONS

This application is the U.S. national phase of PCT Application No. PCT/CN2017/070833 filed on Jan. 11, 2017, which claims priority to Chinese Patent Application No. 201610274032.X filed Apr. 28, 2016, the disclosures of which are incorporated in their entirety by reference herein.

TECHNICAL FIELD

The present disclosure relates to the field of display technology, in particular to an array substrate motherboard, a method for manufacturing the same, and a display device.

BACKGROUND

For a Multi-Mode Group (MMG) product, patterns for two or more display products may be formed on a same base substrate, so as to improve the utilization of the base substrate and reduce the manufacture cost. However, when forming the film layer patterns for different display products on the same array substrate, such a phenomenon as Mura may easily occur.

SUMMARY

An object of the present disclosure is to provide an array substrate motherboard, a method manufacturing the same and a display device, so as to prevent the occurrence of Mura when forming film layer patterns for different display products on an array substrate.

In one aspect, the present disclosure provides in some embodiments a method for manufacturing an array substrate motherboard, including a step of forming a film layer pattern for a first display product at a first region of a base substrate and forming a film layer pattern for a second display product at a second region of the base substrate. The first display product has deep holes at a density larger than the second display product, and each deep hole is a via-hole penetrating through at least two insulation layers. The step of forming the film layer pattern for the first display product at the first region of the base substrate and forming the film layer pattern for the second display product at the second region of the base substrate includes: prior to forming a second conductive pattern on an insulation layer, reducing a thickness of the insulation layer at the first region; and forming the second conductive pattern on the insulation layer, and enabling the second conductive pattern to be connected to a first conductive pattern under the insulation layer through a via-hole structure penetrating through the insulation layer.

In a possible embodiment of the present disclosure, the step of forming the film layer pattern for the first display product at the first region of the base substrate and forming the film layer pattern for the second display product at the second region of the base substrate includes: forming the first conductive pattern; forming the insulation layer covering the first conductive pattern and forming the via-hole structure penetrating through the insulation layer; reducing the thickness of the insulation layer at the first region; and forming the second conductive pattern on the insulation layer.

In a possible embodiment of the present disclosure, the step of forming the insulation layer covering the first conductive pattern, forming the via-hole structure penetrating through the insulation layer, reducing the thickness of the insulation layer at the first region and forming the second conductive pattern on the insulation layer includes: forming the insulation layer on the base substrate with the first conductive pattern; applying a positive photoresist onto the insulation layer, exposing the positive photoresist using a grey-tone mask plate including a fully-transparent pattern corresponding to a region where the via-hole structure is to be formed, a partially-transparent pattern corresponding to the first region other than the region where the via-hole structure is to be formed, and a nontransparent region corresponding to the second region other than the region where the via-hole structure is to be formed; developing the positive photoresist to form a photoresist partially-reserved region, a photoresist unreserved region and a photoresist fully-reserved region; etching off the insulation layer at the photoresist unreserved region, so as to form the via-hole structure penetrating through the insulation layer; and removing the positive photoresist at the photoresist partially-reserved region, and etching the insulation layer at the photoresist partially-reserved region, so as to reduce the thickness of the insulation layer at the photoresist partially-reserved region.

In a possible embodiment of the present disclosure, the step of forming the insulation layer covering the first conductive pattern, forming the via-hole structure penetrating through the insulation layer, reducing the thickness of the insulation layer at the first region and forming the second conductive pattern on the insulation layer includes: forming the insulation layer on the base substrate with the first conductive pattern; applying a negative photoresist onto the insulation layer, and exposing the negative photoresist using a grey-tone mask plate including a nontransparent pattern corresponding to a region where the via-hole structure is to be formed, a partially-transparent pattern corresponding to the first region other than the region where the via-hole structure is to be formed, and a fully-transparent pattern corresponding to the second region other than the region where the via-hole structure is to be formed; developing the negative photoresist so as to form a photoresist partially-reserved region, a photoresist unreserved region and a photoresist fully-reserved region; etching off the insulation layer at the photoresist unreserved region, so as to form the via-hole structure penetrating through the insulation layer; and removing the negative photoresist at the photoresist partially-reserved region, and etching the insulation layer at the photoresist partially-reserved region, so as to reduce the thickness of the insulation layer at the photoresist partially-reserved region.

In a possible embodiment of the present disclosure, the first conductive pattern at the first region includes a drain electrode of a thin film transistor and a pixel electrode, the second conductive pattern at the first region is a conductive connection line connected to the drain electrode and the pixel electrode, and the insulation layer at the first region is a passivation layer.

In a possible embodiment of the present disclosure, the step of forming the film layer pattern for the first display product at the first region of the base substrate further includes: forming the pixel electrode at the first region of the base substrate; forming a gate electrode of the TFT at the first region of the base substrate with the pixel electrode; forming a gate insulation layer at the first region of the base substrate with the gate electrode; forming an active layer on the gate insulation layer at the first region; forming a source electrode and the drain electrode of the thin film transistor at the first region of the base substrate with the active layer; forming a pattern of the passivation layer with the via-hole structure at the first region of the base substrate with the source electrode and the drain electrode of the thin film transistor, the via-hole structure including a first via-hole corresponding to the drain electrode and a second via-hole corresponding to the pixel electrode and penetrating through the gate insulation layer; and forming the conductive connection line on the passivation layer at the first region, the conductive connection line being connected to the drain electrode through the first via-hole and connected to the pixel electrode through the second via-hole.

In a possible embodiment of the present disclosure, the conductive connection line is created from a transparent conductive layer.

In a possible embodiment of the present disclosure, the conductive connection line is formed at a same time with a common electrode at the first region through a single patterning process.

In another aspect, the present disclosure provides in some embodiments an array substrate motherboard, at least including a film layer pattern for a first display product at a first region of a base substrate and a film layer pattern for a second display product at a second region of the base substrate. The first display product has deep holes at a density larger than the second display product, and each deep hole is a via-hole penetrating through at least two insulation layers. The film layer pattern for the first display product at the first region of the base substrate and the film layer pattern for the second display product at the second region of the base substrate include a first conductive pattern arranged under an insulation layer and a second conductive pattern arranged on the insulation layer and connected to the first conductive pattern through a via-hole structure penetrating through the insulation layer. The insulation layer at the first region has a thickness smaller than that of the insulation layer at the second region.

In a possible embodiment of the present disclosure, the first conductive pattern at the first region includes a drain electrode of a thin film transistor and a pixel electrode, the second conductive pattern at the first region is a conductive connection line connected to the drain electrode and the pixel electrode, and the insulation layer at the first region is a passivation layer.

In a possible embodiment of the present disclosure, the film layer pattern for the first display product includes: the pixel electrode arranged at the first region of the base substrate; a gate electrode of the thin film transistor arranged at the first region of the base substrate with the pixel electrode; a gate insulation layer arranged at the first region of the base substrate with the gate electrode; an active layer arranged on the gate insulation layer at the first region; a source electrode and the drain electrode of the thin film transistor arranged at the first region of the base substrate with the active layer; a pattern of the passivation layer with the via-hole structure at the first region of the base substrate with the source electrode and the drain electrode of the thin film transistor, the via-hole structure including a first via-hole corresponding to the drain electrode and a second via-hole corresponding to the pixel electrode and penetrating through the gate insulation layer; and the conductive connection line arranged on the passivation layer at the first region, connected to the drain electrode through the first via-hole, and connected to the pixel electrode through the second via-hole.

In a possible embodiment of the present disclosure, the conductive connection line and a common electrode at the first region are made of a same material and created from a same layer.

In yet another aspect, the present disclosure provides in some embodiments a display device including the first display product.

In still yet another aspect, the present disclosure provides in some embodiments a method for manufacturing an array substrate motherboard, including steps of: forming a film layer pattern for a first display product at a first region of a base substrate, the first display product having deep holes at a first density; and forming a film layer pattern for a second display product at a second region of the base substrate, the second display product having deep holes at a second density smaller than the first density. Each deep hole is a via-hole penetrating at least two insulation layers. The step of forming the film layer pattern for the first display product at the first region of the base substrate and the film layer pattern for the second display product at the second region of the base substrate includes: forming a first conductive pattern on the base substrate; forming an insulation layer covering the first conductive pattern, forming the via-holes at the first density in a portion of the insulation layer at the first region, and forming the via-holes at the second density in a portion of the insulation layer at the second region; reducing a thickness of the portion of the insulation layer at the first region, so that the via-hole at the first region has a depth smaller than the via-hole at the second region; and forming a second conductive pattern on the insulation layer, so that a portion of the second conductive pattern at the first region is connected to a portion of the first conductive pattern at the first region through the via-hole at the first region, and a portion of the second conductive pattern at the second region is connected to a portion of the first conductive pattern at the second region through the via-hole at the second region.

In a possible embodiment of the present disclosure, the portion of the first conductive pattern at the first region includes a drain electrode of a thin film transistor and a pixel electrode, and the portion of the second conductive pattern at the first region includes a conductive connection line connected to the drain electrode and the pixel electrode.

In a possible embodiment of the present disclosure, the portion of the second conductive pattern at the first region further includes a common electrode of the first display product.

According to the embodiments of the present disclosure, in the case of forming the film layer patterns for different display products on the array substrate, the thickness of the insulation layer for the display product with larger pore density may be reduced without any additional patterning process, so as to reduce the depth of each via-hole of the display product. As a result, in the case of applying an alignment film onto the array substrate, it is able to improve a diffusion effect of the alignment film at the via-holes, thereby to prevent the occurrence of Mura.

DETAILED DESCRIPTION

In order to make the objects, the technical solutions and the advantages of the present disclosure more apparent, the present disclosure will be described hereinafter in conjunction with the drawings and embodiments.

Figure 1:
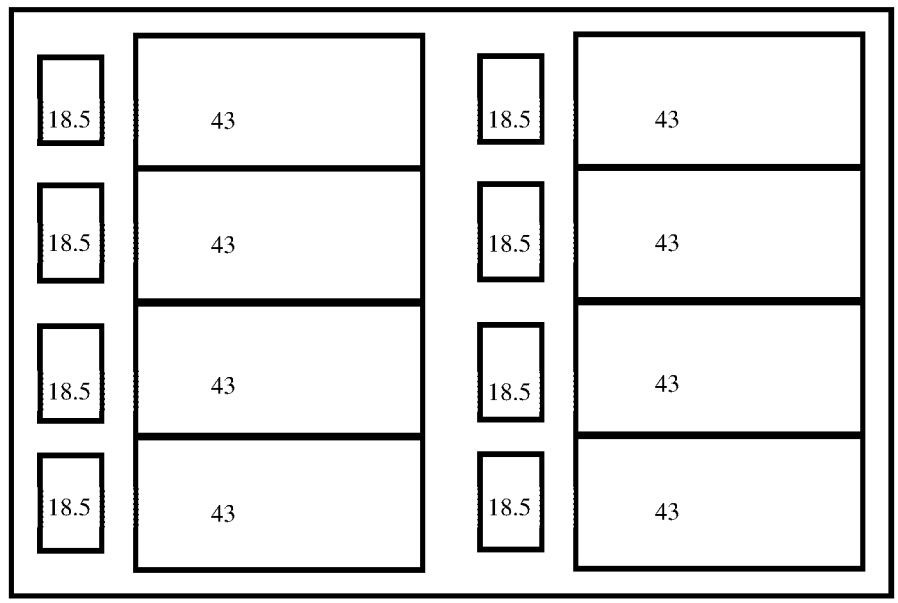
FIG. 1 is a schematic view showing a MMG product.

In the related art, a 43MMG product as shown in FIG. 1 has been manufactured. For the 43MMG product, patterns of a 43-inch Advanced Super Dimension Switch (ADS) display product and a 18.5-inch High Aperture Ratio Advanced Super Dimension Switch (HADS) display product may be formed on a same base substrate.

The 43-inch ADS display product has deep holes at a density smaller than that of the 18.5-inch HADS display product, and each deep hole is a via-hole penetrating through at least two insulation layers.

To be specific, for the above-mentioned 43MMG product, a drain electrode of a thin film transistor and a pixel electrode of the 18.5-inch HADS display product are lapped to each other through the deep hole, i.e., the deep hole is provided at each subpixel region of the 18.5-inch HADS display product. Hence, the density of the deep holes in the 18.5-inch HADS display product is obviously greater than that of the 43-inch ADS display product. Depressions may easily occur at the deep holes, and when applying an alignment film onto an array substrate of the MMG product, the uneven diffusion may easily occur for the alignment film at the deep holes, resulting in such a phenomenon as Mura for the final display product.

An object of the present disclosure is to provide an array substrate motherboard, a method for manufacturing the same and a display device, so as to prevent the occurrence of Mura when forming film layer patterns for different display products on an array substrate.

The present disclosure provides in some embodiments a method for manufacturing an array substrate motherboard, at least including a step of forming a film layer pattern for a first display product at a first region of a base substrate and forming a film layer pattern for a second display product at a second region of the base substrate. The first display product has deep holes at a density greater than that of the second display product, and each deep hole is a via-hole penetrating through at least two insulation layers. To be specific, the method includes reducing a thickness of an insulation layer at the first region and then forming a second conductive pattern on the insulation layer, the second conductive pattern being connected to a first conductive pattern under the insulation layer through a via-hole structure penetrating through the insulation layer.

According to the embodiments of the present disclosure, when forming the film layer patterns for different display products on the array substrate, the thickness of the insulation layer for the display product with larger deep hole density may be reduced without any additional patterning process, so as to reduce the depth of each via-hole of the display product. As a result, when applying an alignment film onto the array substrate, it is able to improve a diffusion effect of the alignment film at the via-holes, thereby to prevent the occurrence of Mura.

In a possible embodiment of the present disclosure, the method includes: forming the first conductive pattern; forming the insulation layer covering the first conductive pattern and forming the via-hole structure penetrating through the insulation layer; reducing the thickness of the insulation layer at the first region; and forming the second conductive pattern on the insulation layer.

In the embodiments of the present disclosure, the thickness of the insulation layer at the first region may be reduced using a grey-tone mask plate or a half-tone mask plate.

In a possible embodiment of the present disclosure, when using a positive photoresist for a photoetching process, the step of forming the insulation layer covering the first conductive pattern, forming the via-hole structure penetrating through the insulation layer, reducing the thickness of the insulation layer at the first region and forming the second conductive pattern on the insulation layer includes: forming the insulation layer on the base substrate with the first conductive pattern; applying the positive photoresist onto the insulation layer, exposing the positive photoresist using a grey-tone mask plate including a fully-transparent pattern corresponding to a region where the via-hole structure is to be formed, a partially-transparent pattern corresponding to the first region other than the region where the via-hole structure is to be formed, and a nontransparent region corresponding to the second region other than the region where the via-hole structure is to be formed; developing the positive photoresist to form a photoresist partially-reserved region, a photoresist unreserved region and a photoresist fully-reserved region; etching off the insulation layer at the photoresist unreserved region, so as to form the via-hole structure penetrating through the insulation layer; and removing the positive photoresist at the photoresist partially-reserved region, and etching the insulation layer at the photoresist partially-reserved region, so as to reduce the thickness of the insulation layer at the photoresist partially-reserved region.

In a possible embodiment of the present disclosure, when using a negative photoresist for the photoetching process, the step of forming the insulation layer covering the first conductive pattern, forming the via-hole structure penetrating through the insulation layer, reducing the thickness of the insulation layer at the first region and forming the second conductive pattern on the insulation layer includes: forming the insulation layer on the base substrate with the first conductive pattern; applying the negative photoresist onto the insulation layer, and exposing the negative photoresist using a grey-tone mask plate including a nontransparent pattern corresponding to a region where the via-hole structure is to be formed, a partially-transparent pattern corresponding to the first region other than the region where the via-hole structure is to be formed, and a fully-transparent pattern corresponding to the second region other than the region where the via-hole structure is to be formed; developing the negative photoresist so as to form a photoresist partially-reserved region, a photoresist unreserved region and a photoresist fully-reserved region; etching off the insulation layer at the photoresist unreserved region, so as to form the via-hole structure penetrating through the insulation layer; and removing the negative photoresist at the photoresist partially-reserved region, and etching the insulation layer at the photoresist partially-reserved region, so as to reduce the thickness of the insulation layer at the photoresist partially-reserved region.

In a possible embodiment of the present disclosure, the first conductive pattern at the first region includes a drain electrode of a thin film transistor and a pixel electrode, the second conductive pattern at the first region is a conductive connection line connected to the drain electrode and the pixel electrode, and the insulation layer at the first region is a passivation layer.

To be specific, the method includes steps of: providing the base substrate; forming the pixel electrode at the first region of the base substrate; forming a gate electrode of the thin film transistor at the first region of the base substrate with the pixel electrode; forming a gate insulation layer at the first region of the base substrate with the gate electrode; forming an active layer on the gate insulation layer at the first region; forming a source electrode and the drain electrode of the thin film transistor at the first region of the base substrate with the active layer; forming a pattern of the passivation layer with the via-hole structure at the first region of the base substrate with the source electrode and the drain electrode of the thin film transistor, the via-hole structure including a first via-hole corresponding to the drain electrode and a second via-hole corresponding to the pixel electrode and penetrating through the gate insulation layer; and forming the conductive connection line on the passivation layer at the first region, the conductive connection line being connected to the drain electrode through the first via-hole and connected to the pixel electrode through the second via-hole.

In a possible embodiment of the present disclosure, in order to prevent a display effect from being adversely affected, the conductive connection line may be created from a transparent conductive layer.

In a possible embodiment of the present disclosure, the conductive connection line is formed together with a common electrode at the first region through a single patterning process. In this way, it is able to reduce the number of patterning processes for manufacturing the array substrate, thereby to increase the production efficiency and reduce the production cost.

The array substrate motherboard in the embodiments of the present disclosure may be arranged opposite to a color filter substrate, so as to form a large display panel. Then, the display panel may be divided into a plurality of 43-inch ADS display products and a plurality of 18.5-inch HADS display products.

The present disclosure further provides in some embodiments an array substrate motherboard, at least including a film layer pattern for a first display product at a first region of a base substrate and a film layer pattern for a second display product at a second region of the base substrate. The first display product has deep holes at a density larger than that of the second display product, and each deep hole is a via-hole penetrating through at least two insulation layers. The array substrate motherboard further includes a first conductive pattern arranged under an insulation layer and a second conductive pattern arranged on the insulation layer and connected to the first conductive pattern through a via-hole structure penetrating through the insulation layer. The insulation layer at the first region has a thickness smaller than that of the insulation layer at the second region.

According to the embodiments of the present disclosure, when forming the film layer patterns for different display products on an array substrate, the insulation layer of the display product having a larger deep hole density may have a relatively small thickness, so the via-hole of this display product may have a relatively small depth. In this way, when applying an alignment film onto the array substrate, it is able to improve a diffusion effect of the alignment film at the via-hoes, thereby to prevent the occurrence of Mura.

In a possible embodiment of the present disclosure, the first conductive pattern at the first region includes a drain electrode of a thin film transistor and a pixel electrode, the second conductive pattern at the first region is a conductive connection line connected to the drain electrode and the pixel electrode, and the insulation layer at the first region is a passivation layer.

To be specific, the array substrate includes: the base substrate; the pixel electrode at the first region of the base substrate; a gate electrode of the thin film transistor at the first region of the base substrate with the pixel electrode; a gate insulation layer at the first region of the base substrate with the gate electrode; an active layer on the gate insulation layer at the first region; a source electrode and the drain electrode of the thin film transistor at the first region of the base substrate with the active layer; a pattern of the passivation layer with the via-hole structure at the first region of the base substrate with the source electrode and the drain electrode of the thin film transistor, the via-hole structure including a first via-hole corresponding to the drain electrode and a second via-hole corresponding to the pixel electrode and penetrating through the gate insulation layer; and the conductive connection line arranged on the passivation layer at the first region, connected to the drain electrode through the first via-hole, and connected to the pixel electrode through the second via-hole.

In a possible embodiment of the present disclosure, the conductive connection line is created from a layer identical to a common electrode at the first region. In this way, the conductive connection line and the common electrode may be formed through a single patterning process, so it is able to reduce the number of the patterning processes for manufacturing the array substrate, improve the production efficiency and reduce the production cost.

The present disclosure further provides in some embodiments a display device including the above-mentioned first region. The display device may be any product or member having a display function, such as a liquid crystal panel, a liquid crystal television, a liquid crystal display, a digital photo frame, a mobile phone, a flat-panel computer, a navigator or an electronic paper.

The method for manufacturing the array substrate motherboard will be described hereinafter by taking a 43MMG product as an example. The method includes steps of forming a pattern of a first transparent conductive layer, forming a pattern of a gate metal layer, forming a pattern of a source-drain metal layer, forming a passivation layer and forming a pattern of a second transparent conductive layer. In the embodiments of the present disclosure, on the premise that a conventional manufacture process for forming the array substrate remains unchanged, the passivation layer may be exposed using a half-tone or grey-tone mask plate, and then such processes as etching and ashing may be used so as to enable a thickness of the passivation layer for the 18.5-inch HADS display product to be smaller than that for the 43-inch ADS display product. As a result, it is able to reduce a depth of a via-hole in the passivation layer for the 18.5-inch HADS display product without any additional patterning process. To be specific, the method for manufacturing the array substrate motherboard may include the following steps.

Figure 2:
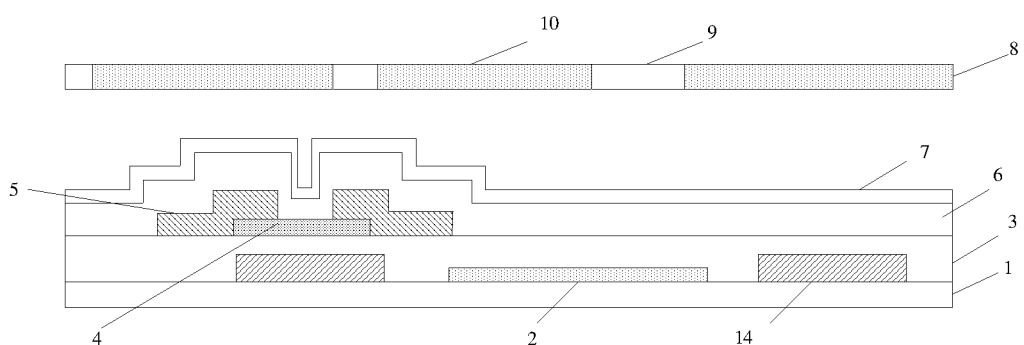
FIG. 2 is a schematic view showing an array substrate motherboard acquired after exposing a photoresist according to at least one embodiment of the present disclosure.

Step 1: providing a base substrate 1, depositing a first transparent conductive layer 2 onto the base substrate 1, and forming a pattern of the first transparent conductive layer 2 through a patterning process, as shown in FIG. 2.

The base substrate 1 may be a glass substrate or a quartz substrate. To be specific, the first transparent conductive layer 2 having a thickness of about 20 to 1000 Å A may be deposited onto the base substrate 1 through magnetron sputtering, thermal evaporation or any other film-forming methods. The first transparent conductive layer 2 may be made of indium tin oxide (ITO). Next, a photoresist may be applied onto the first transparent conductive layer 2, and then exposed and developed. Then, the first transparent conductive layer 2 may be etched, and the photoresist may be removed, so as to form the pattern of the first transparent conductive layer 2. As shown in FIG. 2, the pattern of the first transparent conductive layer 2 may be a pixel electrode for the 18.5-inch HADS display product. Further, the pattern of the first transparent conductive layer 2 may include a common electrode for the 43-inch ADS display product.

Step 2: forming a pattern of a gate metal layer 14 on the base substrate 1 acquired after Step 1.

To be specific, the gate metal layer having a thickness of about 2000 to 6000 Å may be deposited onto the base substrate 1 acquired after Step 1 through magnetron sputtering, thermal evaporation or any other film-forming methods. The gate metal layer 14 may be made of Cu, Al, Ag, Mo, Cr, Nd, Ni, Mn, Ti, Ta or W, or an alloy thereof. It may be of a single-layered structure, or a multi-layered structure such as Cu/Mo, Ti/Cu/Ti or Mo/Al/Mo. Next, a photoresist may be applied onto the gate metal layer 14, and then exposed using a mask plate, so as to form a photoresist reserved region corresponding to a region where the pattern of the gate metal layer 14 is located and a photoresist unreserved region corresponding to the other region. Next, the photoresist may be developed, so as to fully remove the photoresist at the photoresist unreserved region, and maintain a thickness of the photoresist at the photoresist reserved region. Then, the gate metal layer at the photoresist unreserved region may be etched off through an etching process, and the remaining photoresist may be removed, so as to form the pattern of the gate metal layer 14. The pattern of the gate metal layer 14 includes a gate line and a gate electrode of the thin film transistor for the 43-inch ADS display product, and a gate line and a gate electrode of the thin film transistor for the 18.5-inch HADS display product.

Step 3: forming a pattern of a gate insulation layer 3 and an active layer 4 on the base substrate 1 acquired after Step 2.

To be specific, the gate insulation layer 3 having a thickness of about 2000 to 6000 Å may be deposited onto the base substrate 1 acquired after Step 2 through Plasma Enhanced Chemical Vapor Deposition (PECVD). The gate insulation layer 3 may be made of an oxide, a nitride or an oxynitride. It may be of a single-layered, double-layered or multilayered structure. To be specific, the gate insulation layer 3 may be made of $SiN_x$, $SiO_x$ or $Si(ON)_x$.

Next, a semiconductor layer having a thickness of about 20 to 1000 Å may be deposited onto the gate insulation layer 3 through magnetron sputtering, thermal evaporation or any other film-forming methods. Then, a photoresist may be applied onto the semiconductor layer, and then exposed and developed. And then, the semiconductor layer may be etched off, and the photoresist may be removed, so as to form the pattern of the active layer 4 including the semiconductor layer. The pattern of the active layer 4 includes an active layer for the 43-inch ADS display product and an active layer for the 18.5-inch HADS display product.

Step 4: forming a pattern of a source-drain metal layer 5 on the base substrate 1 acquired after Step 3.

To be specific, the source-drain metal layer 5 having a thickness of about 2000 to 6000 Å may be deposited onto the base substrate 1 acquired after Step 3 through magnetron sputtering, thermal evaporation or any other film-forming methods. The source-drain metal layer 5 may be made of Cu, Al, Ag, Mo, Cr, Nd, Ni, Mn, Ti, Ta or W, or an alloy thereof. The source-drain metal layer 5 may be of a single-layered structure, or a multilayered structure such as Cu/Mo, Ti/Cu/Ti or Mo/Al/Mo. Next, a photoresist may be applied onto the source-drain metal layer 5, and then exposed using a mask plate, so as to form a photoresist reserved region corresponding to a region where the source-drain metal layer 5 is located and a photoresist unreserved region corresponding to the other region. Next, the photoresist may be developed, so as to fully remove the photoresist at the photoresist unreserved region, and maintain a thickness of the photoresist at the photoresist reserved region. Then, the source-drain metal layer at the photoresist unreserved region may be fully etched off through an etching process, and the remaining photoresist may be removed, so as to form the pattern of the source-drain metal layer 5. The pattern of the source-drain metal layer 5 includes a data line and a source electrode and a drain electrode of the thin film transistor for the 43-inch ADS display product, and a data line and a source electrode and a drain electrode of the thin film transistor for the 18.5-inch HADS display product.

Step 5: forming a pattern of a passivation layer 6 with a via-hole structure on the base substrate 1 acquired after Step 4, the via-hole structure including a first via-hole corresponding to the drain electrode for the 18.5-inch HADS display product, and a second via-hole corresponding to the pixel electrode for the 18.5-inch HADS display product and penetrating through the gate insulation layer 3.

To be specific, as shown in FIG. 2, the passivation layer 6 may be deposited onto the base substrate 1 acquired after Step 4. Next, a photoresist 7 may be applied onto the passivation layer 6, and then exposed using a grey-tone mask plate 8 including a fully-transparent pattern 9 corresponding to a region where the via-hole structure is to be formed, a partially-transparent pattern 10 corresponding the first region other than the region where the via-hole structure is to be formed, and a non-transparent pattern corresponding to the second region other than the region where the via-hole structure is to be formed. The first region is a region where the 18.5-inch HADS display product is located, and the second region is a region where the 43-inch ADS display product is located.

Figure 3:
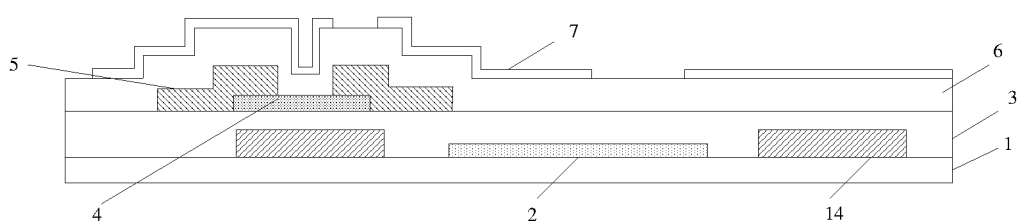
FIG. 3 is a schematic view showing the array substrate motherboard acquired after developing the photoresist according to at least one embodiment of the present disclosure.

As shown in FIG. 3, the photoresist 7 may be developed, so as to form a photoresist partially-reserved region, a photoresist unreserved region and a photoresist fully-reserved region (not shown).

Figure 4:
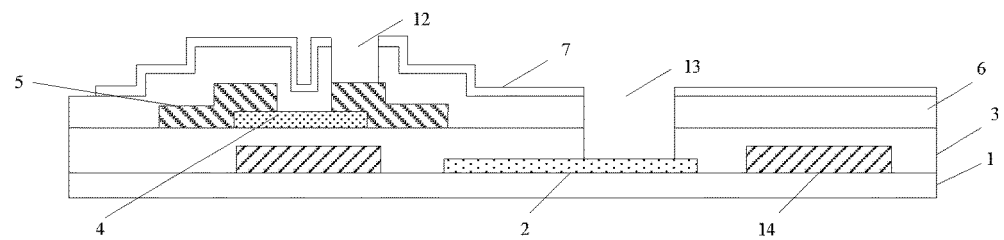
FIG. 4 is a schematic view showing the array substrate motherboard acquired after the formation of via-holes by etching according to at least one embodiment of the present disclosure.

As shown in FIG. 4, the passivation layer 6 at the photoresist unreserved region may be etched off, so as to form the via-hole structure penetrating through the passivation layer 6. At the first region in FIG. 4, the via-hole structure includes a first via-hole 12 corresponding to the drain electrode for the 18.5-inch HADS display product and a second via-hole 13 corresponding to the pixel electrode for the 18.5-inch HADS display product. The first via-hole 12 penetrates through the passivation layer 6, and the second via-hole 13 penetrates through the passivation layer 6 and the gate insulation layer 3. In addition, as shown in FIG. 4, the source-drain metal layer 5 includes a left portion and a right portion separated from each other, and the right portion of the source-drain metal layer 5 may be the drain electrode for the 18.5-inch HADS display product.

Figure 5:
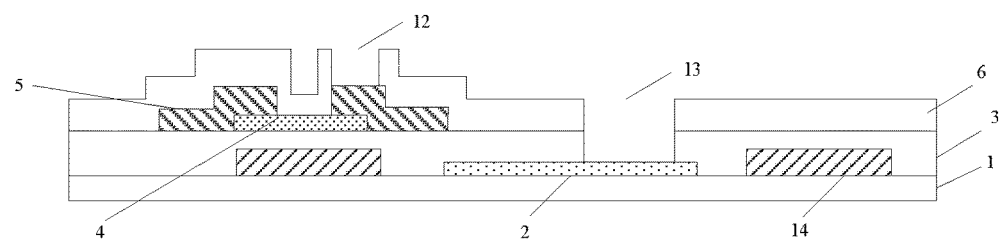
FIG. 5 is a schematic view showing the array substrate motherboard acquired after an ashing operation on the photoresist according to at least one embodiment of the present disclosure.

As shown in FIG. 5, the photoresist 7 at the photoresist partially-reserved region and the photoresist fully-reserved region may be etched through an ashing process, so as to fully remove the photoresist 7 at the photoresist partially-reserved region and reduce a thickness of the photoresist 7 at the photoresist fully-reserved region.

Figure 6:
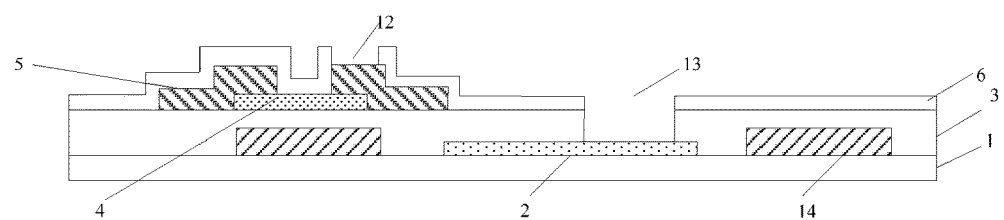
FIG. 6 is a schematic view showing the array substrate motherboard acquired after a thickness of a passivation layer is reduced according to at least one embodiment of the present disclosure.

As shown in FIG. 6, the passivation layer 6 at the photoresist partially-reserved region may be etched, so s to reduce the thickness of the passivation layer 6 at the photoresist partially-reserved region by accurately controlling an etching time period, thereby to reduce depths of the first via-hole 12 and the second via-hole 13, reduce segment differences between the first via-hole 12 and the second via-hole 13, and prevent the occurrence of Mura. At this time, the photoresist 7 is still maintained at the photoresist fully-reserved region, so the thickness of the passivation layer 6 corresponding to the photoresist fully-reserved region may not be reduced, i.e., finally the thickness of the passivation layer 6 at the first region may be smaller than that of the passivation layer 6 at the second region.

Step 6: forming a second transparent conductive layer 11 on the base substrate acquired after Step 5, 1 and patterning the second transparent conductive layer 11 so as to form a pattern of the second transparent conductive layer 11.

Figure 7:
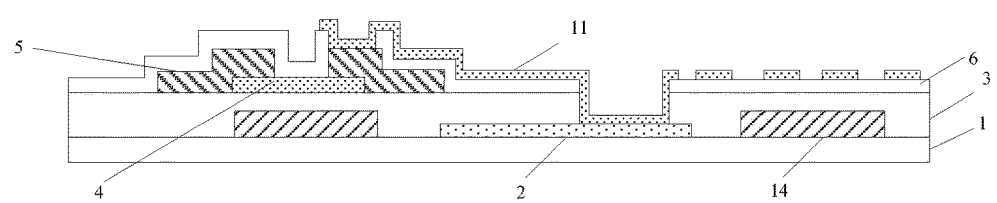
FIG. 7 is a schematic view showing the array substrate motherboard acquired after the formation of a second transparent conductive layer according to at least one embodiment of the present disclosure.

To be specific, as shown in FIG. 7, the second transparent conductive layer 11 having a thickness of about 20 to 1000 Å may be deposited onto the base substrate 1 acquired after Step 5 through magnetron sputtering, thermal evaporation or any other film-forming methods, and it may be made of ITO. Next, a photoresist may be applied onto the second transparent conductive layer 11, and then exposed and developed. Next, the second transparent conductive layer 11 may be etched, and the photoresist may be removed, so as to form the pattern of the second transparent conductive layer 11. The pattern of the second transparent conductive layer 11 includes the conductive connection line, the pixel electrode for the 43-inch ADS display product and the common electrode for the 18.5-inch HADS display product. For the 18.5-inch HADS display product, the conductive connection line is connected to the drain electrode of the thin film transistor through the first via-hole 12, and connected to the pixel electrode through the second via-hole 13. Through the conductive connection line, it is able to electrically connect the drain electrode of the thin film transistor to the pixel electrode.

The array substrate motherboard in FIG. 7 may be manufactured through the above-mentioned Steps 1 to 6. According to the embodiments of the present disclosure, on the premise that a conventional manufacture process for forming the array substrate remains unchanged, the passivation layer may be exposed using a half-tone or grey-tone mask plate, so as to enable the thickness of the passivation layer for the 18.5-inch HADS display product to be smaller than that for the 43-inch ADS display product. As a result, it is able to reduce the depth of the via-hole in the passivation layer for the 18.5-inch HADS display product without any additional patterning process. As a result, when applying an alignment film onto the array substrate, it is able to improve a diffusion effect of the alignment film at the via-holes, thereby to prevent the occurrence of Mura.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A method for manufacturing an array substrate motherboard, comprising:
    forming a film layer pattern for a first display product at a first region of a base substrate and forming a film layer pattern for a second display product at a second region of the base substrate, wherein
    the first display product has deep holes at a density larger than that of the second display product, and each deep hole is a via-hole penetrating through at least two insulation layers,
    the step of forming the film layer pattern for the first display product at the first region of the base substrate and forming the film layer pattern for the second display product at the second region of the base substrate comprises:
    prior to forming a second conductive pattern on an insulation layer, reducing a thickness of the insulation layer at the first region; and
    forming the second conductive pattern on the insulation layer, and enabling the second conductive pattern to be connected to a first conductive pattern under the insulation layer through a via-hole structure penetrating through the insulation layer;
    wherein the step of forming the film layer pattern for the first display product at the first region of the base substrate and forming the film layer pattern for the second display product at the second region of the base substrate comprises:
    forming the first conductive pattern;
    forming the insulation layer covering the first conductive pattern and forming the via-hole structure penetrating through the insulation layer;
    reducing the thickness of the insulation layer at the first region; and
    forming the second conductive pattern on the insulation layer;
    wherein the step of forming the insulation layer covering the first conductive pattern and forming the via-hole structure penetrating through the insulation layer, reducing the thickness of the insulation layer at the first region and forming the second conductive pattern on the insulation layer comprises:
    forming the insulation layer on the base substrate with the first conductive pattern; applying a positive photoresist onto the insulation layer, exposing the positive photoresist using a grey-tone mask plate comprising a fully-transparent pattern corresponding to a region where the via-hole structure is to be formed, a partially-transparent pattern corresponding to the first region other than the region where the via-hole structure is to be formed, and a nontransparent region corresponding to the second region other than the region where the via-hole structure is to be formed; developing the positive photoresist to form a photoresist partially-reserved region, a photoresist unreserved region and a photoresist fully-reserved region; etching off the insulation layer at the photoresist unreserved region, so as to form the via-hole structure penetrating through the insulation layer; and removing the positive photoresist at the photoresist partially-reserved region, and etching the insulation layer at the photoresist partially-reserved region, to reduce the thickness of the insulation layer at the photoresist partially-reserved region.

2. The method according to claim 1, wherein the first conductive pattern at the first region comprises a drain electrode of a thin film transistor and a pixel electrode, the second conductive pattern at the first region is a conductive connection line connected to the drain electrode of the thin film transistor and the pixel electrode, and the insulation layer at the first region is a passivation layer.

3. The method according to claim 2, wherein the conductive connection line is created from a transparent conductive layer.

4. The method according to claim 1, wherein the first conductive pattern at the first region comprises a drain electrode of a thin film transistor and a pixel electrode, the second conductive pattern at the first region is a conductive connection line connected to the drain electrode and the pixel electrode, and the insulation layer at the first region is a passivation layer, the step of forming the film layer pattern for the first display product at the first region of the base substrate further comprises:
forming the pixel electrode at the first region of the base substrate;
forming a gate electrode of a thin film transistor at the first region of the base substrate with the pixel electrode;
forming a gate insulation layer at the first region of the base substrate with the gate electrode;
forming an active layer on the gate insulation layer at the first region;
forming a source electrode and the drain electrode of the thin film transistor at the first region of the base substrate with the active layer;
forming a pattern of the passivation layer with the via-hole structure at the first region of the base substrate with the source electrode and the drain electrode of the thin film transistor, the via-hole structure comprising a first via-hole corresponding to the drain electrode and a second via-hole corresponding to the pixel electrode and penetrating through the gate insulation layer; and
forming the conductive connection line on the passivation layer at the first region, the conductive connection line being connected to the drain electrode through the first via-hole and connected to the pixel electrode through the second via-hole.

5. The method according to claim 4, wherein the conductive connection line is created from a transparent conductive layer.

6. The method according to claim 5, wherein the conductive connection line is formed at a same time with a common electrode at the first region through a single patterning process.

7. A method for manufacturing an array substrate motherboard, comprising:
forming a film layer pattern for a first display product at a first region of a base substrate, the first display product having deep holes at a first density; and
forming a film layer pattern for a second display product at a second region of the base substrate, the second display product having deep holes at a second density smaller than the first density,
wherein each deep hole is a via-hole penetrating at least two insulation layers,
the step of forming the film layer pattern for the first display product at the first region of the base substrate and the film layer pattern for the second display product at the second region of the base substrate comprises:
forming a first conductive pattern on the base substrate;
forming an insulation layer covering the first conductive pattern, forming the via-holes at the first density in a portion of the insulation layer at the first region, and forming the via-holes at the second density in a portion of the insulation layer at the second region;
reducing a thickness of the portion of the insulation layer at the first region, so that the via-hole at the first region has a depth smaller than the via-hole at the second region; and
forming a second conductive pattern on the insulation layer, so that a portion of the second conductive pattern at the first region is connected to a portion of the first conductive pattern at the first region through the via-hole at the first region, and a portion of the second conductive pattern at the second region is connected to a portion of the first conductive pattern at the second region through the via-hole at the second region.

8. The method according to claim 7, wherein the portion of the first conductive pattern at the first region comprises a drain electrode of a thin film transistor and a pixel electrode, and the portion of the second conductive pattern at the first region comprises a conductive connection line connected to the drain electrode of the thin film transistor and the pixel electrode.

9. The method according to claim 7, wherein the portion of the second conductive pattern at the first region further comprises a common electrode of the first display product.

10. A method for manufacturing an array substrate motherboard, comprising:
forming a film layer pattern for a first display product at a first region of a base substrate and forming a film layer pattern for a second display product at a second region of the base substrate, wherein
the first display product has deep holes at a density larger than that of the second display product, and each deep hole is a via-hole penetrating through at least two insulation layers,
the step of forming the film layer pattern for the first display product at the first region of the base substrate and forming the film layer pattern for the second display product at the second region of the base substrate comprises:
prior to forming a second conductive pattern on an insulation layer, reducing a thickness of the insulation layer at the first region; and
forming the second conductive pattern on the insulation layer, and enabling the second conductive pattern to be connected to a first conductive pattern under the insulation layer through a via-hole structure penetrating through the insulation layer;
wherein the step of forming the film layer pattern for the first display product at the first region of the base substrate and forming the film layer pattern for the second display product at the second region of the base substrate comprises:
forming the first conductive pattern;
forming the insulation layer covering the first conductive pattern and forming the via-hole structure penetrating through the insulation layer;
reducing the thickness of the insulation layer at the first region; and
forming the second conductive pattern on the insulation layer;

wherein the step of forming the insulation layer covering the first conductive pattern and forming the via-hole structure penetrating through the insulation layer, reducing the thickness of the insulation layer at the first region and forming the second conductive pattern on the insulation layer comprises:

forming the insulation layer on the base substrate with the first conductive pattern; applying a negative photoresist onto the insulation layer, and exposing the negative photoresist using a grey-tone mask plate comprising a nontransparent pattern corresponding to a region where the via-hole structure is to be formed, a partially-transparent pattern corresponding to the first region other than the region where the via-hole structure is to be formed, and a fully-transparent pattern corresponding to the second region other than the region where the via-hole structure is to be formed; developing the negative photoresist to form a photoresist partially-reserved region, a photoresist unreserved region and a photoresist fully-reserved region; etching off the insulation layer at the photoresist unreserved region, to form the via-hole structure penetrating through the insulation layer; and removing the negative photoresist at the photoresist partially-reserved region, and etching the insulation layer at the photoresist partially-reserved region, to reduce the thickness of the insulation layer at the photoresist partially-reserved region.

11. The method according to claim 10, wherein the first conductive pattern at the first region comprises a drain electrode of a thin film transistor and a pixel electrode, the second conductive pattern at the first region is a conductive connection line connected to the drain electrode of the thin film transistor and the pixel electrode, and the insulation layer at the first region is a passivation layer.

* * * * *